United States Patent [19]

Kinney

[11] Patent Number: 5,357,463

[45] Date of Patent: Oct. 18, 1994

[54] METHOD FOR REVERSE PROGRAMMING OF A FLASH EEPROM

[75] Inventor: Wayne I. Kinney, Boise, Id.

[73] Assignee: Micron Semiconductor, Inc., Boise, Id.

[21] Appl. No.: 977,644

[22] Filed: Nov. 17, 1992

[51] Int. Cl.[5] .............................................. G11C 11/40
[52] U.S. Cl. ..................................... 365/185; 365/218
[58] Field of Search ............... 365/185, 218, 189.01, 365/104, 900

[56] References Cited

U.S. PATENT DOCUMENTS

| | | | |
|---|---|---|---|
| 4,766,473 | 8/1988 | Kuo | 365/185 |
| 4,878,101 | 10/1989 | Hsieh et al. | 365/185 |
| 4,924,437 | 5/1990 | Paterson et al. | 365/185 |
| 5,053,990 | 10/1991 | Kreifels et al. | 365/185 |
| 5,122,985 | 6/1992 | Santin | 365/185 |
| 5,126,808 | 6/1992 | Montalov et al. | 367/23.5 |
| 5,132,935 | 7/1992 | Ashmore, Jr. | 365/185 |
| 5,222,040 | 6/1993 | Challa | 365/185 |

Primary Examiner—Eugene R. LaRoche
Assistant Examiner—Vu Le
Attorney, Agent, or Firm—Hopkins, Roden, Crockett, Hansen & Hoopes

[57] ABSTRACT

A method of erasing, programming, and verifying a flash electrically erasable programmable read-only memory where all cells are first erased to a high threshold voltage, preferably by simultaneous Fowler-Nordheim tunnelling, and then selected cells are programmed to a low threshold voltage using Fowler-Nordheim tunnelling. Programming is achieved by applying a negative voltage to the selected wordline and applying a positive voltage to the selected bitline. Only those cells which have both the wordline and bitline selected will have sufficient wordline-to-bitline voltage difference to cause programming. A key advantage of this new method is that a verification (read) procedure can be used to monitor for the desirable tight distribution, low threshold voltage $V_t$ on programmed cells and re-program only those cells which have a $V_t$ higher than the desired $V_t$. The resulting tight distribution of cell current in programmed cells will lead to faster and more reliable read characteristics for these devices.

8 Claims, 2 Drawing Sheets

ERASE

PROGRAM (READ)

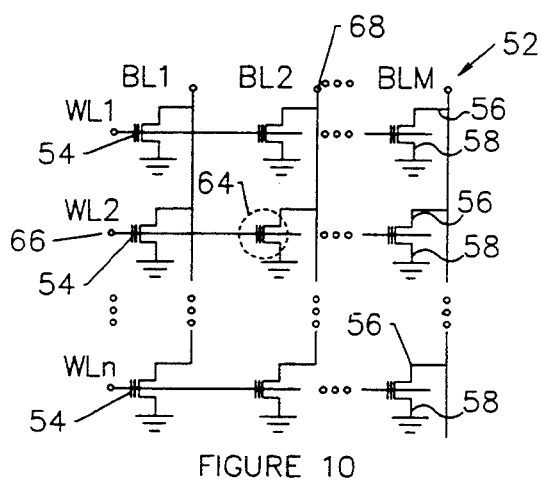
FIGURE 10
| | ERASE | WL2-BL2 PROGRAM | | WL1-BL2 READ |
|---|---|---|---|---|
| | | (1) | (0) | |
| WL1 | 17v. | 0 | 0 | 0 |
| WL2 | 17v. | -10v. | -10v. | +5v. |
| ⋮ | | | | |
| WLn | 17v. | 0 | 0 | 0 |
| | | | | |
| BL1 | FLOAT | 0 | 0 | FLOAT |
| BL2 | FLOAT | +5v. | 0 | +1.5v. |
| ⋮ | | | | |
| BLM | FLOAT | 0 | 0 | FLOAT |
FIGURE 11
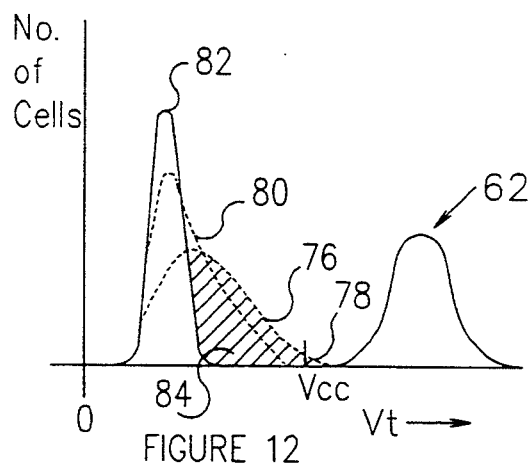
FIGURE 12

METHOD FOR REVERSE PROGRAMMING OF A FLASH EEPROM

FIELD OF THE INVENTION

This invention relates to a method of programming a flash electrically erasable programmable read-only memory (EEPROM) by using a flash (or bulk) erase to a high threshold voltage and a program of selected cells to a low threshold voltage. Programming to a low threshold voltage is carried out using Fowler-Nordheim (F-N) tunnelling.

BACKGROUND OF THE INVENTION

In a conventional flash EEPROM ("flash" indicating all memory cells or sectors of cells can be erased at once), memory cells are simultaneously erased to a low threshold voltage and then programmed, either individually or in small groups, to a high threshold voltage.

Another conventional EEPROM erase voltage application is illustrated in the memory cell 10 of FIG. 1 (prior art) and the programming voltages for this cell are illustrated in FIG. 2.

In this conventional stacked gate flash memory, all the memory cells must be programmed before the erase pulse application to avoid over-erasure problems. This takes about 2.6 seconds in a 16 Mb memory even if 8-byte page mode programming and a $10\mu$ second pulse are utilized. In contrast, the "erase" pulse application and the "verify" cycle each take about 500 ms. Thus, the erase period length is dominated by the programming-before-erase cycle.

In the conventional erasing scheme shown in FIG. 1, the high voltage (12 V.) is applied to the source diffusion layer 12 and the control gate 14 is grounded. Electrons 16 tunnel from the floating gate to the source by means of F-N tunnelling mechanism. In addition, electron-hole pairs are generated in the substrate by the band-to-band tunnelling. The holes are accelerated by the large lateral electric field between the source and substrate leading to avalanche multiplication. Some of the resulting hot carriers are injected into the tunnel oxide and, unfortunately, degrade the endurance characteristics of the memory cell. Moreover, as the scaling of the memory cell decreases the breakdown voltage of the source junction, a high erase voltage cannot be applied to the source.

As illustrated in FIG. 2, programming of the conventional cell 10 is activated by grounding the source 12, applying the high voltage to the control gate 14, which causes channel hot-electron (CHE) injection into the floating gate 18.

In this scheme, as each memory cell is programmed with channel hot-electron injection, the maximum number of memory cells programmed simultaneously is limited because of the large programming current needed. To overcome the above drawbacks, i.e., programming time before erase, and lowered endurance characteristics after multiple program and erase cycles, a Mitsubishi flash EEPROM memory cell 22 is illustrated in "flash erase" mode in FIG. 3 and "flash program" mode of FIG. 4. This devise utilizes the F-N tunnelling concept to program each cell simultaneously. In this erase application of FIG. 3, a +5 voltage is applied to source 24 and a $-12$ voltage is applied to control gate 26.

FIG. 4 illustrates the programming voltages on a cell that utilizes a back gate bias scheme by applying a generated negative 2 volt bias to substrate 28. In this case $+12$ volts is applied to control gate 26. This scheme induces an electric field across the gate oxide 30 large enough to activate F-N tunnelling to charge floating gate 32. Since all memory cells can be flash programmed simultaneously, the programming-before-erasure time period and subsequent erase operation time is significantly reduced, and the endurance over hundreds of erase/write cycles is enhanced.

U.S. Pat. No. 5,126,808 issued to Montalvo et al. on Jun. 30, 1992 discloses a flash EEPROM array architecture including a plurality of pages. Each page of the array is isolated from other pages in the array during reading, programming, and erasing of the page. The architecture of this invention includes means for erasing through the gate of the flash EEPROM cell. The erasing voltages and programming voltages are indicated on FIGS. 5 and 6, respectively. Erase is accomplished by a $-12$ volt control gate 34 signal and a ground or zero volts source 36 voltage for several hundred milliseconds. Programming is done by applying a $+12$ volt gate signal for $10\mu$ seconds, with zero volts on source 36 and $+6$ volts on drain 38 charging floating gate 40 by channel-hot electron injection.

A brief discussion of disadvantages of FIGS. 3–6 is as follows:

Flash erase to a low $V_t$, as in FIG. 3, is susceptible to a broad distribution of erased $V_t$ and possible over-erase. The maximum erased $V_t$ allowed must be sufficiently high so that the lowest erased $V_t$ is still well above 0 V. A high allowed erase $V_t$ implies that the cell current during read operation will be low and additional time will be required for reliably sensing the cell state. Also, excessively low erased $V_t$ will lower the cell punch-through voltage and impede subsequent programming of other cells on the same bitline (see discussion of FIG. 6 below).

Flash programming to a high $V_t$ prior to erase is a good idea, as in FIG. 4. It can also be accomplished using a grounded substrate and higher gate voltage. It is only useful for "flash" programming prior to erase because all cells obtain the same state. By necessity, this approach requires flash erase to a low $V_t$ with the associated problems (see discussion of FIG. 3 above).

The principle of FIG. 5 is the same as FIG. 3. However, a portion of the erase tunnelling current flows to the substrate. The same problems of erase $V_t$ distribution discussed in FIG. 3 occur for this condition. Also, temporary electron trapping in the channel region can cause inaccurate $V_t$ sensing during the erase verification cycles.

In FIG. 6, the standard CHE programming requires high current levels. Also, the punch-through (VDTO) of unaddressed cells on a bitline can pin the bitline voltage at a level that is too low to permit programming of the selected bit on that bitline. In practice, this limits the minimum channel length that can be used in the array. The proposed programming technique of the instant invention should be less susceptible to this since cells can be designed to program at drain voltages lower than $V_{CC}$.

One feature of this proposed technique is that the speed of programming for an individual cell will be substantially longer than for CHE. However, since little current is required during programming, many cells can be programmed simultaneously. This means that on-board latches will be needed to hold the required data during programming. In practice, the programming time for a typical block of data will be about the same using our technique as for using CHE, and the extra area needed (overhead) for data latches should be negligible.

Some of the problems in designing and fabricating flash EEPROM cells include over-erasing cells where the cell threshold voltage $V_t$ becomes negative and, on the other end of the distribution curve, cells that have threshold voltages above the normal maximum allowed erase $V_t$, in which case an erased cell will be read as a programmed cell.

An EEPROM cell is over-erased when an excess of electrons is removed from the floating gate during the erase operation creating a conducting path between the source and drain when the control gate and the source are at the same voltage. Over-erased cells create read cycle inaccuracies.

In a conventional EEPROM cell, as described in U.S. Pat. No. 5,122,985 issued on Jun. 16, 1992 to Santin, the floating gate of a properly programmed memory cell is charged with electrons, and the electrons in turn render the source-drain path under the charged floating gate nonconductive when a chosen wordline select voltage, i.e., $V_{CC}$, is applied to the control gate. This nonconductive state is read as a "zero" bit.

The floating gate of a non-programmed cell is positively charged, neutrally charged, or slightly negatively charged, such that the source-drain path under the non-programmed floating gate is conductive when the same chosen wordline select voltage $V_{CC}$ is applied to the control gate This conductive state is read as a "one" bit.

After conventional programming, the distribution of threshold voltage $V_t$ is shifted to a higher range, i.e., +4 to +9 volts; and, after erasing, the $V_t$ is lowered to a range of perhaps 1–3.5 volts.

SUMMARY OF THE INVENTION

In this inventive method, all cells are first erased to a high threshold voltage, preferably by simultaneous Fowler-Nordheim tunnelling, and then selected cells are programmed to a low threshold voltage using Fowler-Nordheim tunnelling. Programming is achieved by applying a negative voltage to the selected wordline and applying a positive voltage to the selected bitlines. Only those cells which have both the wordline and bitline selected will have sufficient wordline-to-bitline voltage difference to cause programming.

A key advantage of this new method is that a verification (read) procedure can be used to monitor for the desirable, tightly distributed, low threshold voltage on programmed cells. Program/verify cycling continues until all cells have the desired $V_t$. The resulting tight distribution of cell current in programmed cells will lead to faster and more reliable read characteristics for these devices It is the purpose of this invention to provide a NOR structure memory erase/program/verify method for flash EEPROM cells that has improved write/erase cycle endurance by use of F-N tunnelling in both the program (write) and erase phases. It is a further purpose to avoid a wide distribution of erase threshold voltages by setting the low $V_t$ state during the "program/verify program" phase. This tighter distribution of the low $V_t$ state gives a tighter distribution of cell currents and, therefore, more reliable read characteristics and faster access time. It is a further purpose of this invention to avoid over-erasure of the memory cells. It is a further purpose of this invention to allow selective programming of cells not having a proper low $V_t$. It is a further purpose of this invention by the use of F-N tunnelling to allow a single external power supply, e.g., 5 volts, and use an on-board chip voltage pumps for both the negative program and positive erase operations.

To accomplish the above purposes, a method is disclosed for erasing, programming, and verifying flash electrically erasable programmable read-only memory cells, each cell having a source, drain, control gate, floating gate, and substrate. The method comprising:

applying a positive high voltage to each cell control gate while grounding the drain, thereby erasing a cell data bit and providing a high threshold voltage $V_t$ or optionally, using a negative substrate bias as in FIG. 4;

programming selected cells by applying a negative second voltage to a selected cell control gate and applying a voltage $V_{CC}$ to the drain to program a "one" or grounding the drain to program a "zero", thereby providing a lower $V_t$ on "one" programmed cells and maintaining a higher $V_t$ on "zero" programmed cells;

verifying the programming and threshold voltage of each cell by a read verification cycle; and repeating the programming and read verification cycle only on selected cells having a threshold voltage $V_t$ above a preferred threshold voltage distribution curve, until all cells have a $V_t$ that lies below the preferred voltage distribution curve.

Other objects, advantages, and capabilities of the present invention will become more apparent as the description proceeds.

BRIEF DESCRIPTION OF THE DRAWINGS

FIG. 10 is a schematic diagram of an array of a flash EEPROM cell;

FIG. 11 is a table listing the mode voltages for erase, program, and read of FIGS. 7–9; and FIG. 12 is a graph showing the distribution of threshold voltages $V_t$ during the erase, program, and read cycles of the present invention.

DETAILED DESCRIPTION OF THE INVENTION

Figure 7:
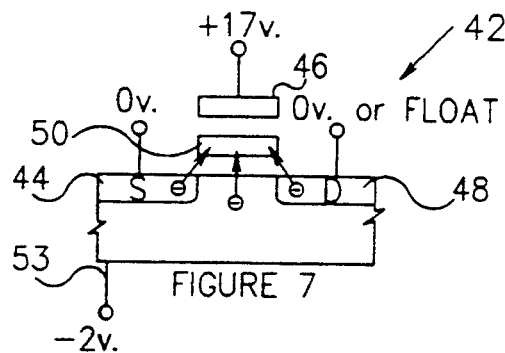
FIG. 7 is a cross-section view of a flash EEPROM in the erase mode of the present inventive method.
Figure 8:
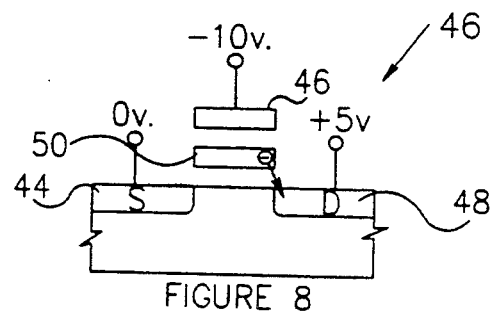
FIG. 8 is a cross-section view of a flash EEPROM in the program mode of the present inventive method.
Figure 9:
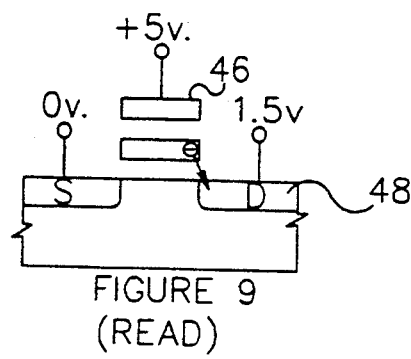
FIG. 9 is a cross-section view of a flash EEPROM in the read mode of the present inventive method.

Referring now to FIGS. 7, 8, and 9, the method of erasing, programming, and then verifying data within a single cell is done by application of voltages to the source, drain, and control gate in reverse of normal programming techniques. The normal sequence is: program before erase (to avoid over-erasure), multiple erase, and erase verify cycles until all cells have a sufficiently low $V_t$.

Figure 1:
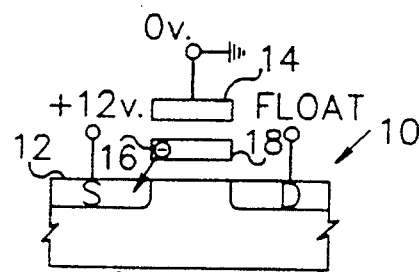
FIG. 1 is a cross-section view of an EEPROM in the erase mode (prior art)
Figure 2:
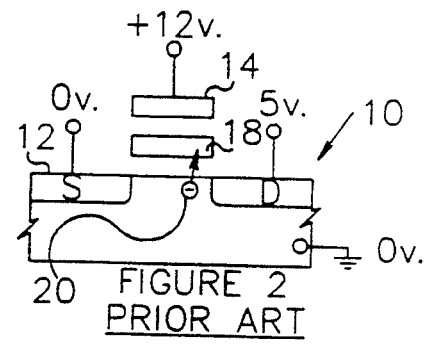
FIG. 2 is a cross-section view of an EEPROM in the program mode (prior art)
Figure 3:
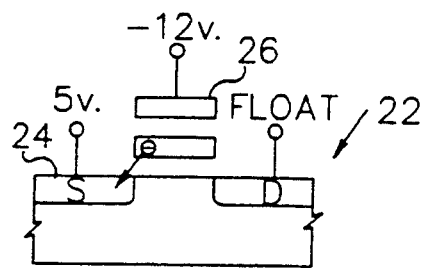
FIG. 3 is a cross-section view of a flash EEPROM in the erase mode (prior art)
Figure 4:
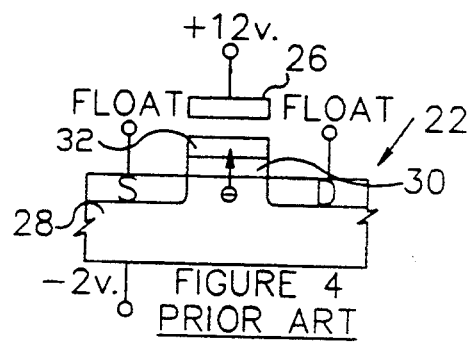
FIG. 4 is a cross-section view of a flash EEPROM in the program mode (prior art)
Figure 5:
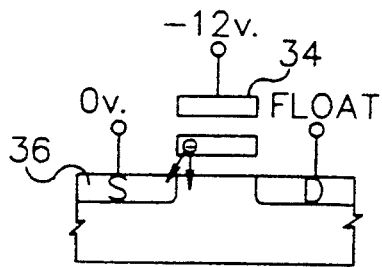
FIG. 5 is a cross-section view of another flash EEPROM in the erase mode (prior art)
Figure 6:
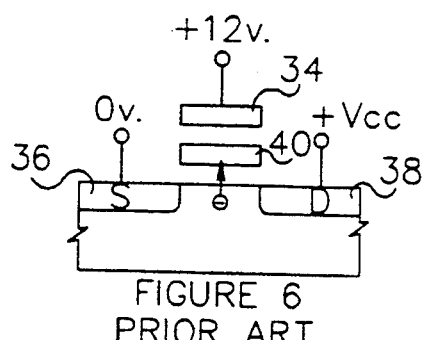
FIG. 6 is a cross-section view of another flash EEPROM in the program mode (prior art)

FIG. 7 shows the voltage application of the present invention for the erase mode on cell 42. The source 44 is maintained at zero volts while about +17 volts is applied to the control gate 46. As an option, a negative substrate bias can also be used as in the method of FIG. 4. The drain 48 can be at ground (zero volts) or float. Negative charge is added to the floating gate by F-N tunnelling from the substrate and/or source and drain regions.

Following erase, the programming as in FIG. 8 applies a −10 volts on the control gate 46, while the source is at ground and the drain 48 is at about +5 volts. F-N tunnelling in this case causes negative charge to leave the floating gate 50. The "read" step would follow programming to verify the programmed data. As shown in FIG. 9, for read, the source is at zero or ground, the gate 46 is at about, but not limited to, +5 volts and the drain 48 is at about 1.5 volts.

FIG. 10 illustrates a partial array of flash EEPROM cells. Based on the results of the read step if the expected current does not indicate a $V_t$ in an acceptable range below a preferred maximum $V_t$ and in a preferred normal distribution, that particular cell is re-programmed and re-read until it is within the preferred normal distribution.

In FIG. 10 a partial array 52 of cells is disclosed having "N" wordlines (WLN) connecting to contact gates 54, and "M" number of bitlines (BLM) connected to the transistor drain as at 56, where "M" and "N" can represent numbers in the thousands. Each of the source terminals 58 in this array 52 is at ground or zero potential.

To first "erase" the array 52, either by wordlines or the whole array, the selected wordlines are raised to a high voltage and, optionally, applying a negative voltage bias to the substrate as at 53 (FIG. 7), while bitlines are at "float" or zero volts, at each drain 56. These "erase" voltages can be seen in the "erase" column 60 of FIG. 11. Thus, the array 52 can be flash erased by sectors or all cells simultaneously.

The effect of erasing at +17 volts is to raise the threshold voltage $V_t$ of all cells to high state distributed values as seen at 62 of FIG. 12. These values will typically be in the range of 4–9 volts and will have a somewhat "normal" distribution.

Following the high state flash erase, the cells are then programmed individually by bits or by individually selected wordlines. Although any number of bits can be simultaneously programmed, up to a full wordline worth, in the example given, cell 64 is programmed at wordline 2 (WL2) at 66 and bitline 2 (BL2) at 68 by applying −10 volts to WL2 66 and +5 volts to BL2 68. These values can be seen in the table column 20 of FIG. 11, with the remaining wordlines and bitlines at zero or ground. In this example, memory cell 64 would be programmed as a "one". Zeros are programmed by having bitlines at zero volts as in column 72 of FIG. 11.

As a result of programming at −10 volts on control gates 54, with bitline 2 drain voltage at +5, a shift of the cell 54 threshold voltage $V_t$ occurs. After all desired cells are programmed a first time and then "read" by typical application of voltages in the read column 74 of FIG. 11, the distribution of threshold voltages $V_t$ could have the shape of dotted line curve 76 of FIG. 12. While although not having negative or close to zero low end $V_t$'s curve 76 has an undesirable distribution on the high end at 78 being above $V_{CC}$. To correct this problem the array cells that are determined by "read" to be above the desired $V_t$ voltage are re-programmed which would then give a distribution somewhat like dotted line curve 80. Although $V_t$ curve 80 has lower values than $V_t$ curve 76, it does not have the desired tight distribution of voltages as in curve 82, consequently, additional pro-gram/verify cycles may be necessary to eliminate those $V_t$ voltages in shaded area 84. Again, only those cells having voltages in shaded area 84 are re-programmed and verified. Re-programming/verify cycles would continue on selected cells in area 84 until all cell $V_t$'s are under preferred distribution curve 82, at which time re-programming would be complete.

In this low, tight distribution, $V_t$ state method, the array would have the desirable characteristics as follows:
immunity to negative $V_t$ conditions;
faster and more reliable read characteristics;
immunity to cell punch-through (VDTO) during program and erase;
improved write/erase endurance;
easier decoding; and
low current requirements for write and erase.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of erasing, programming, and verifying flash electrically erasable programmable read-only memory cells, each cell having a source, drain, control gate, floating gate, and substrate; the method comprising:
   a. applying a positive high voltage to each cell control gate while grounding or floating the drain, thereby erasing a cell data bit and providing a high threshold voltage $V_t$ on each cell;
   b. programming each cell by applying a negative second voltage to each cell control gate while grounding the source and applying a voltage $V_{CC}$ to the drain to program a "one" or grounding the drain to program a "zero", thereby providing a lower $V_t$ on each "one" cell;
   c. verifying the programming and threshold voltage of each cell by a read verification cycle, said read cycle further comprising:
      i. applying voltage $V_{CC}$ to a selected cell gate and grounding unselected cell gates;
      ii. applying a positive voltage to a selected cell drain and floating an unselected cell drain; and then
   d. repeating the programming and read verification cycle only on selected cells having a threshold voltage $V_t$ above a preferred threshold voltage distribution curve, until all cells have a $V_t$ that lie below the preferred voltage distribution curve.

2. The method of claim 1 wherein the positive high voltage is about 17 volts and the negative second voltage is about −10 volts and the voltage $V_{CC}$ is about +5 volts.

3. A method of erasing, selectively programming, and verifying a flash electrically erasable read-only memory (EEPROM) cell within an array of flash EEPROM cells arranged in rows and columns, each cell in a row having a control gate connecting a wordline and each cell in a column having a drain connection to a bitline; the method comprising:

a. erasing the cell array by simultaneous application of a high positive voltage on the wordlines and having a float or zero volts on the bit lines and a grounded source, thereby providing a high threshold voltage $V_t$ on all cells;

b. programming a selected cell or cells by application of a negative voltage on a selected wordline and application of a zero or a positive voltage on a selected bitline, thereby providing a lower threshold voltage $V_t$ on selected cells;

c. verifying a proper data input and lower voltage $V_t$ on selected cells by application of a lower positive voltage on the selected wordline and application of a low, positive voltage on the selected bitline and floating unselected bitlines; and d. repeating the programming and verifying steps above until all cell threshold voltages $V_t$ lie within a preferred tight, normal, distribution curve.

4. The method of claim 3 wherein the high, positive voltage during erase is about +17 volts.

5. The method of claim 4 wherein the negative voltage during programming is about −10 volts and the positive voltage on the bitline during programming is about +5 volts.

6. The method of claim 4 wherein a zero is programmed by having zero volts on the selected bitline.

7. The method of claim 3 wherein a negative voltage is applied to the substrate.

8. A method of erasing, selectively programming, and verifying a flash electrically erasable read-only memory (EEPROM) cell within an array of flash EEPROM cells arranged in rows and columns, each cell in a row having a control gate connecting a wordline and each cell in a column having a drain connection to a bitline; the method comprising:

a. erasing the cell array by simultaneous application of about +17 volts on the wordlines and having a float or zero volts on the bit lines, thereby providing a high threshold voltage $V_t$ on all cells;

b. programming a selected cell or cells by application of −10 volts on a selected wordline and application of a zero or a positive voltage on a selected bitline and a grounded source, thereby providing a lower threshold voltage $V_t$ on selected cells;

c. verifying a proper data input and lower voltage $V_t$ on selected cells by application of about +5 volts on the selected wordline and application of +1.5 volts on the selected bitline and floating unselected bitlines; and d. repeating the programming and verifying steps above until all cell threshold voltages $V_t$ lie within a preferred tight, normal, distribution curve above zero volts and below +5 volts.

* * * * *